United States Patent
Kawai et al.

(10) Patent No.: US 11,014,343 B2
(45) Date of Patent: May 25, 2021

(54) TRANSPARENT HIGH-BARRIER FILM AND HIGH-BARRIER LAYERED BODY USING SAME

(71) Applicant: REIKO CO., LTD., Kyoto (JP)

(72) Inventors: Kimio Kawai, Shiga (JP); Ryo Nishiyama, Shiga (JP); Kazumi Yoshida, Shiga (JP)

(73) Assignee: REIKO CO., LTD., Kyoto (JP)

( * ) Notice: Subject to any disclaimer, the term of this patent is extended or adjusted under 35 U.S.C. 154(b) by 300 days.

(21) Appl. No.: 16/096,382

(22) PCT Filed: Sep. 6, 2016

(86) PCT No.: PCT/JP2016/004060
§ 371 (c)(1),
(2) Date: Oct. 25, 2018

(87) PCT Pub. No.: WO2018/047208
PCT Pub. Date: Mar. 15, 2018

(65) Prior Publication Data
US 2019/0134959 A1    May 9, 2019

(51) Int. Cl.
*B32B 27/08* (2006.01)
*B32B 27/28* (2006.01)
*B32B 9/00* (2006.01)

(52) U.S. Cl.
CPC ............... *B32B 27/08* (2013.01); *B32B 9/00* (2013.01); *B32B 27/285* (2013.01); *B32B 2255/20* (2013.01)

(58) Field of Classification Search
CPC .................................................. B32B 2255/20
See application file for complete search history.

(56) References Cited

U.S. PATENT DOCUMENTS

2010/0003483 A1    1/2010  Fukuda

FOREIGN PATENT DOCUMENTS

| | | |
|---|---|---|
| JP | 2003342735 | 12/2003 |
| JP | 2005088424 | 4/2005 |
| JP | 2010-201888 | 9/2010 |
| KR | 10-2013-0125362 | 11/2013 |
| KR | 10-2014-0099043 | 8/2014 |
| WO | 2012/060424 A1 | 5/2012 |
| WO | 2013147119 | 10/2013 |

OTHER PUBLICATIONS

International Search Report issued in PCT/JP2016/004060, dated Nov. 1, 2016.
J. Ulbrig, M.Bedjaouri, S. Martin, S. Cros, J.E. Bouree: "Deposition of high permeation barrier films byplasma-enhanced chemical vapor deposition for organic solar cells".The Compiled State-Of-The-Art of PV Solar Technology and Deployment: 23rd European Photovoltaic Solar Energy Conference, EU PVSEC; Proceedings of the International Conference, Held in Valencia, Spain Sep. 1-5, 2008, WIP-Renewable Energies, D, Sep. 1, 2008 (Sep. 1, 2008).
European Search Report in counterpart European Application 6915632.0-1103/3511438, dated Apr. 3, 2020.
Chinese Patent Office—Office Action in counterpart Chinese Application No. 201680085697.4, dated Mar. 4, 2020, English Translation.

*Primary Examiner* — Ian A Rummel
(74) *Attorney, Agent, or Firm* — Kirschstein, Israel, Schiffmiller & Pieroni, P.C.

(57) ABSTRACT

A transparent high-barrier film having flexibility and a high-barrier property is usable as a packaging material for pharmaceutical products, or as a flexible sealing material. The high-barrier film includes a plastic film and at least a barrier layer stacked thereon. The barrier layer is a layer in which two or more units are stacked, each unit having a structure in which a barrier layer A, a barrier layer B, and a barrier layer A are stacked in that order. The barrier layer A is a layer composed of SiOC in which the content ratio of carbon is in a range of more than 0% and less than 15%. The barrier layer B is a layer composed of SiOC in which the content ratio of carbon is in a range of 1.1 to 4.0 times the content ratio of carbon in the barrier layer A.

16 Claims, No Drawings

TRANSPARENT HIGH-BARRIER FILM AND HIGH-BARRIER LAYERED BODY USING SAME

TECHNICAL FIELD

The present invention relates to a barrier film which is used as a packaging material for food products and daily necessities or a sealing material for solar cells, electronic paper, organic EL and the like, and particularly to a transparent high-barrier film with high-barrier property, which is excellent in water vapor barrier property for blocking water vapor (hereinafter, sometimes referred to simply as barrier property), and can be used as a packaging material for pharmaceutical products requiring particularly excellent water vapor barrier property, or a sealing material for solar cells, electronic paper, organic EL and the like. The high-barrier property mentioned herein means that the water vapor transmission rate is $5 \times 10^{-5}$ g/m$^2$ day or less.

BACKGROUND ART

For suppressing degeneration of contents to maintain the functions and quality thereof, a general barrier film should prevent influences of gases which degenerate the contents, such as oxygen and water vapor passing through a packaging material or a sealing material. Therefore, the barrier film is required to have at least water vapor barrier property.

A barrier film which is used as a packaging material for pharmaceutical products is particularly required to have high-barrier property for blocking water vapor in order to prevent deterioration of the quality of pharmaceutical products as contents by water vapor and the like. In addition, a high-barrier film is desired which is also transparent so that pharmaceutical products as contents can be visually observed.

With advancement of development of solar cells, electronic paper, organic EL and the like, research and development for making these articles flexible is being conducted. A glass substrate which has been heretofore used as a sealing material for solar cells, electronic paper, organic EL and the like has high-barrier property, but is easily broken because of low flexibility, and thus cannot be used as a sealing material for flexible solar cell, electronic paper, organic EL and the like (hereinafter, referred to as a "flexible sealing material").

In addition, a general barrier film which is used as a packaging material for food products and daily necessities does not have high-barrier property required for a packaging material for pharmaceutical products or a flexible sealing material as described above, and therefore cannot be used as a packaging material for pharmaceutical products or a flexible sealing material.

Patent Document 1 discloses a transparent gas barrier layered film which can be suitably used for packaging materials and FPDs (flat panel displays) in the field of packagings for food products, daily necessities, pharmaceutical products and the like, and the field of materials associated with electronic devices. In the gas barrier layered film, an anchor layer containing a polymerizable acrylic monomer or mixture of a monomer and an oligomer, and a gas barrier layer composed of silicon oxide represented by SiOxCy (x is 1.5 or more and 2.0 or less, and y is 0 or more and 0.5 or less) are stacked in this order on a plastic film.

PRIOR ART DOCUMENT

Patent Document

Patent Document 1: JP-A-2010-201888

SUMMARY OF THE INVENTION

Problems to be Solved by the Invention

However, in the gas barrier layered film disclosed in Patent Document 1, an anchor coat layer, and a gas barrier layer (barrier layer) composed of silicon oxide represented by SiOxCy (x is 1.5 or more and 2.0 or less, and y is 0 or more and 0.5 or less) are stacked on a plastic film as described above, and the layer stacked as a barrier layer is a single layer. Therefore, this gas barrier layered film has improved water vapor barrier property as compared to a general barrier film, but does not satisfy high-barrier property (water vapor transmission rate of $5 \times 10^{-5}$ g/m$^2$·day or less) required for a barrier film to be used as a packaging material for pharmaceutical products or a flexible sealing material, and cannot be used as such a barrier film.

Further, in the gas barrier layered film disclosed in Patent Document 1, the gas barrier layer (barrier layer) is a single layer, and therefore when defects such as pinholes, which cause deterioration of barrier property, are generated in the gas barrier layer, the defects cannot be repaired, and high-barrier property cannot be reliably exhibited.

An object of the present invention is to solve the above-described problems, and provide a transparent high-barrier film which can be adequately used even in applications requiring high-barrier property.

Means for Solving the Problems

[1] The present invention provides a transparent high-barrier film including a plastic film, and at least a barrier layer stacked on one surface or both surfaces of the plastic film, the transparent high-barrier film satisfying all of the following requirements (A) to (C):

(A) the barrier layer is a layer in which two or more units are stacked, each unit having a structure in which a barrier layer A, a barrier layer B and a barrier layer A are stacked in this order;

(B) the barrier layer A is a layer composed of SiOC in which the content ratio of carbon quantitatively analyzed by X-ray photoelectron spectroscopy (XPS) of the barrier layer A is in a range of more than 0% and less than 15%; and (C) the barrier layer B is a layer composed of SiOC in which the content ratio of carbon quantitatively analyzed by X-ray photoelectron spectroscopy (XPS) of the barrier layer B is in a range of 1.1 to 4.0 times the content ratio of carbon in the barrier layer A.

[2] The present invention is the transparent high-barrier film according to [1], wherein the thickness of each of the barrier layer A and the barrier layer B is in a range of 5 to 30 nm.

[3] The present invention provides a high-barrier layered body in which the transparent high-barrier film according to [1] or [2] and a functional film are bonded to each other with a pressure sensitive adhesive layer or adhesive layer interposed therebetween.

Effect of the Invention

The transparent high-barrier film of the present invention has high transparency, and is capable of exhibiting high-barrier property because the barrier layer stacked in the transparent high-barrier film of the present invention has a multilayer structure of barrier layers A and barrier layers B which are each composed of SiOC and have different content ratios of carbon. Specifically, the transparent high-barrier film of the present invention has two or more units stacked on one surface or both surfaces of a plastic film, each unit having a structure in which a barrier layer A, a barrier layer B and a barrier layer A are stacked in this order, the barrier layer A being composed of SiOC in which the content ratio of carbon quantitatively analyzed by X-ray photoelectron spectroscopy (XPS) is more than 0% and less than 15%, the barrier layer B being composed of SiOC in which the content ratio of carbon quantitatively analyzed by X-ray photoelectron spectroscopy (XPS) is in a range of 1.1 to 4.0 times the content ratio of carbon in the barrier layer A.

As a result, the transparent high-barrier film of the present invention exhibits high-barrier property (water vapor transmission rate of $5 \times 10^{-5}$ g/m$^2$·day or less), and can be adequately used as a packaging material for pharmaceutical products or a flexible sealing material, requiring high-barrier property.

In the transparent high-barrier film of the present invention, the thickness of each of the barrier layer A and the barrier layer B is more preferably in a range of 5 to 30 nm for exhibiting high-barrier property.

The SiOC mentioned herein does not indicate a state in which the content ratio of silicon (Si), oxygen (O) and carbon (C) is Si:O:C=1:1:1, but indicates that the content ratio of silicon (Si) and oxygen (O) varies depending on the content ratio of carbon (C).

In addition, when the transparent high-barrier film of the present invention is used as a packaging material, contents can be observed, and there is no problem in practical use as long as the transparent high-barrier film of the present invention has a total light transmittance of 80% or more.

In the high-barrier layered body of the present invention, the transparent high-barrier film of the present invention and a functional film are bonded to each other with a pressure sensitive adhesive layer or adhesive layer interposed therebetween, and functions of the functional film are imparted to the layered body while the high-barrier property of the transparent high-barrier film of the present invention is maintained.

Mode for Carrying Out the Invention (Plastic Film)

The plastic film to be used for a transparent high-barrier film of the present invention is not particularly limited, and various known plastic films such as polyethylene terephthalate films, polycarbonate films, polyethylene films, polypropylene films and polyamide films can be used. The plastic film may be any of an unstretched film, a uniaxially stretched film and a biaxially stretched film, and may contain various additives such as an antistatic agent, a coloring agent, a thermal stabilizer and the like. In addition, the type and thickness of the plastic film may be appropriately selected according to the intended use and purpose.

The plastic film may be a one in which a surface treatment such as a coating for easy adhesion or a corona treatment has been applied onto the plastic film for the purpose of enhancing adhesive strength between the plastic film and a layer stacked on the plastic film (the barrier layer A or an anchor coat layer as described later), and the plastic films herein also include plastic films subjected to such a surface treatment.

The thickness of the plastic film is not particularly limited, but is preferably in a range of 12 to 250 µm. It is not preferable that the thickness of the plastic film is less than 12 µm because curls, creases and the like may be easily generated in production of the transparent high-barrier film of the present invention, and it is not preferable that the thickness of the plastic film is more than 250 µm because production costs increase in production of the transparent high-barrier film of the present invention.

(Barrier Layer)

The barrier layer stacked in the transparent high-barrier film of the present invention is a layer which is stacked for the purpose of imparting high-barrier property, and has a multilayer structure of barrier layers A and barrier layers B which are composed of SiOC, and have different content ratios of carbon.

In the transparent high-barrier film of the present invention, the barrier layer is a layer of multilayer structure in which two or more units are stacked on one surface or both surfaces of the plastic film, each unit having a structure in which a barrier layer A, a barrier layer B and a barrier layer A are stacked in this order, so that high-barrier property is exhibited.

For ensuring that the transparent high-barrier film of the present invention reliably exhibits high-barrier property, the barrier layer A and the barrier layer B of the transparent high-barrier film of the present invention should be configured such that the barrier layer A is a layer composed of SiOC in which the content ratio of carbon quantitatively analyzed by X-ray photoelectron spectroscopy (XPS) is more than 0% and less than 15%, and the barrier layer B is a layer composed of SiOC in which the content ratio of carbon quantitatively analyzed by X-ray photoelectron spectroscopy (XPS) is in a range of 1.1 to 4.0 times the content ratio of carbon in the barrier layer A.

In the transparent high-barrier film of the present invention, even if defects such as pinholes, which cause deterioration of barrier property, are generated at the time of, for example, stacking the barrier layer, the defects can be covered and repaired because the barrier layer has a multilayer structure, so that high-barrier property can be reliably exhibited without deteriorating barrier property.

The thickness of the barrier layer of the transparent high-barrier film of the present invention (the total thickness of the barrier layers A and the barrier layers B) may be appropriately selected according to the purpose of use, desired permeability, barrier property or the like, but is preferably in a range of 150 to 450 nm. It is not preferable that the thickness (total thickness) of the barrier layer is less than 150 nm because the function of blocking water vapor cannot be sufficiently exhibited, and it may be impossible to exhibit desired high-barrier property, and it is not preferable that the thickness (total thickness) of the barrier layer is larger than 450 nm because when the film is formed into a roll during production, or the like, application of external stress such as bending or tension easily causes generation of cracks in the barrier layer, so that it may be impossible to exhibit desired high-barrier property.

The thickness of each of the barrier layer A and the barrier layer B (single layer) may be appropriately selected according to a desired purpose, but the thickness of each of the barrier layer A and the barrier layer B (single layer) is preferably in a range of 5 to 30 nm. When in the transparent high-barrier film of the present invention, the barrier layer is a layer of multilayer structure in which two or more units are stacked, each unit having a structure in which a barrier layer A, a barrier layer B and a barrier layer A are stacked in this order, and the total number of barrier layers A and barrier layers B is 6 to 90, high-barrier property can be reliably exhibited.

For example, when the barrier layer of the transparent high-barrier film of the present invention is a layer in which two units are stacked, each unit having a structure in which a barrier layer A, a barrier layer B and a barrier layer A are stacked in this order, the transparent high-barrier film has a structure of plastic film/barrier layer A1/barrier layer B1/barrier layer A2/barrier layer A3/barrier layer B2/barrier layer A4. The thicknesses and content ratios of carbon of the barrier layers A1 to A4 may be the same or different, and each appropriately selected according to the purpose of use, desired permeability, barrier property or the like. The same applies to the thicknesses and content ratios of carbon of the barrier layer B1 and the barrier layer B2.

The method for stacking the barrier layer A and the barrier layer B is preferably a method using a chemical vapor deposition method (CVD method), and particularly, it is preferable to stack the layer using a plasma chemical vapor deposition method (plasma-enhanced CVD method) in which a silane-based compound is vaporized and mixed with oxygen, the mixture is introduced between electrodes, and power is applied by a plasma generator to generate a plasma, thereby forming the layer.

When a plasma-enhanced CVD method is used, processing conditions such as the type of silane-based compound to be used, the mixing ratio of the silane-based compound and oxygen, the intensity of applied power and the degree of vacuum in the CVD apparatus can be relatively easily changed, and therefore by appropriately adjusting each of these processing conditions, a multilayer structure of barrier layers A and barrier layers B having different content ratios of carbon can be easily formed.

The silane-based compound that can be used is not particularly limited, and previously known silane-based compounds such as tetraethoxysilane (TEOS), tetramethoxysilane (TMOS), tetramethylsilane (TMS), tetramethyldisilazane (TMDS), tetramethyldisiloxane, hexamethyldisiloxane (HMDSO) and methyltrimethoxysilane (MTMS) can be used. The silane-based compound may be appropriately selected according to a desired purpose.

In addition, in the transparent high-barrier film of the present invention, an anchor coat layer composed of a resin may be stacked between the plastic film and the barrier layer A for the purpose of, for example, enhancing adhesive strength between the plastic film and the barrier layer A as long as the effect of the present invention is not impaired. In addition, in the transparent high-barrier film of the present invention, a top coat layer composed of a resin may be stacked on the outermost layer of the transparent high-barrier film of the present invention for the purpose of, for example, preventing the barrier layer from being scratched.

In the transparent high-barrier film of the present invention, one or both of the anchor coat layer and the top coat layer may be stacked.

The resin to be used for the anchor coat layer and the top coat layer may be one of various known resins such as polyethylene resins, polypropylene resins, polystyrene resins, vinyl chloride resins, polyester resins, acrylic resins, urethane resins, melamine resins and epoxy resins, or a mixed resin of two or more thereof, and may be appropriately selected according to a purpose. In addition, various additives such as an antistatic agent, an ultraviolet absorber, a coloring agent and a thermal stabilizer may be added to the anchor coat layer and the top coat layer as necessary.

As a method of laminating the anchor coat layer and the top coat layer, a previously known coating method such as a gravure coating method, a reverse coating method, a die coating method, a micro-gravure coating (reverse gravure coating) method or a bar coating method can be used, and the method may be appropriately selected according to a purpose. The thickness of each of the anchor coat layer and the top coat layer may be appropriately selected according to a purpose of stacking the anchor coat layer and the top coat layer.

(High-Barrier Layered Body)

In the high-barrier layered body of the present invention, the transparent high-barrier film of the present invention and a functional film are bonded to each other with a pressure sensitive adhesive layer or adhesive layer interposed therebetween, and functions of the functional film are imparted to the layered body while the high-barrier property of the transparent high-barrier film of the present invention is maintained. In the high-barrier layered body of the present invention, the plastic film surface of the transparent high-barrier film of the present invention and a functional film may be bonded to each other, or the barrier layer-side surface of the transparent high-barrier film of the present invention and a functional film may be bonded to each other.

The functional film may be a plastic film alone, or may be a plastic film on which a functional layer is stacked.

As a plastic film to be used for the functional film, one identical to the plastic film used in the transparent high-barrier film of the present invention can be used, and the type, thickness and the like of the plastic film to be used may be appropriately selected according to a purpose.

The function of the high-barrier layered body of the present invention when only a plastic film is used as a functional film is such that the so called stiffness of the high-barrier layered body of the present invention can be enhanced while the high-barrier property of the transparent high-barrier film of the present invention, which is efficiently produced using a relatively thin plastic film, is maintained, and the total thickness of the high-barrier layered body of the present invention can be easily set to a desired thickness.

The functional layer is a layer stacked on a plastic film for the purpose of imparting various functions such as design property, hard coat property, conductivity, antifouling property, antireflection property, weather resistance and antifogging property. The functional layer is a layer including one of a colored layer, a printed layer, a hard coat layer, a conductive layer, an antifouling layer, an antireflection layer, a weather-resistant resin layer, an antifogging layer and the like, or a combination of these layers. All of the layers that form the functional layer may be stacked on the whole or part of the surface of the plastic film, or any of the layers that form the functional layer may be stacked on the whole or part of the surface of the plastic film.

The thickness of the functional layer may be any thickness as long as a desired effect of the functional layer can be obtained, and the thickness of the functional layer is preferably 1 to 50 μm, and may be appropriately selected according to a desired function. The method for stacking the functional layer may be appropriately selected according to a functional layer to be stacked.

The pressure-sensitive adhesive layer or adhesive layer to be used in the high-barrier layered body of the present invention is a layer composed of a resin, and a pressure-sensitive adhesive or adhesive composed of a previously known resin to be used for bonding plastic films together, such as an acrylic resin or a polyether resin, can be used. The type and thickness of the resin to be used for the pressure sensitive adhesive or adhesive may be any thickness as long as the above-described effect can be obtained, and the thickness is preferably 3 to 30 μm, and may be appropriately selected according to a purpose. The pressure-sensitive adhesive layer or adhesive layer to be used in the high-barrier layered body of the present invention may be transparent or opaque.

As described above, the transparent high-barrier film of the present invention is characterized in that the barrier layer is a layer in which two or more units are stacked on one surface or both surfaces of a plastic film, each unit having a structure in which a barrier layer A, a barrier layer B and a barrier layer A are stacked in this order, the barrier layer A being composed of SiOC in which the content ratio of carbon quantitatively analyzed by X-ray photoelectron spectroscopy (XPS) is in a range of more than 0% and less than 15%, the barrier layer B being composed of SiOC in which the content ratio of carbon quantitatively analyzed by X-ray photoelectron spectroscopy (XPS) is in a range of 1.1 to 4.0 times the content ratio of carbon in the barrier layer A. As a result, the transparent high-barrier film of the present invention has high-barrier property with a water vapor transmission rate of $5\times10^{-5}$ g/m²·day or less, and can be adequately used in applications requiring flexibility and high-barrier property, such as packaging materials for pharmaceutical products and flexible sealing materials. In the transparent high-barrier film of the present invention, the thickness of each of the barrier layer A and the barrier layer B is more preferably in a range of 5 to 30 nm for exhibiting high-barrier property.

EXAMPLES

[Method for Calculating Content Ratio of Carbon in Barrier Layer A or Barrier Layer B]

The content ratio of carbon quantitatively analyzed by X-ray photoelectron spectroscopy (XPS) of a barrier layer A or barrier layer B was determined from the ratio of peak areas obtained by analyzing the barrier layer A or barrier layer B under the following measurement conditions by the following apparatus, and determining a background by a Shirley method.

Measurement apparatus: JPS-9010 MC manufactured by JEOL Ltd.
Measurement light source: Mg-Kα ray
Measurement power: 100 W Example 1

The following (step 1) to (step 3) were carried out in this order to obtain a transparent high-barrier film of the present invention in Example 1 in which an anchor coat layer, a barrier layer and a top coat layer are stacked in this order on one surface of a plastic film (24 units are stacked, each unit having a structure of barrier layer A/barrier layer B/barrier layer A).

(Step 1) a 1.5 μm-thick anchor coat layer was stacked on one surface of a 50 μm-thick long polyethylene terephthalate film (trade name: Lumirror U483 manufactured by Toray Industries, Inc.) by applying an acrylic ultraviolet-curable resin by a gravure coating method.

(Step 2) a barrier layer having a total thickness of 288 nm was stacked on the anchor coat layer by stacking 24 units by a plasma-enhanced CVD method using hexamethyldisiloxane (HMDSO) as a silane-based compound, each unit having a structure in which a 4 nm-thick barrier layer A composed of SiOC, a 4 nm-thick barrier layer B composed of SiOC and a 4 nm-thick barrier layer A composed of SiOC are stacked in this order. The content ratio of carbon was 4.0% in each of the barrier layers A and 7.2% in each of the barrier layers B, and the content ratio of carbon in the barrier layer B was 1.8 times the content ratio of carbon in the barrier layer A.

(Step 3) a 0.1 μm-thick top coat layer was stacked on the barrier layer A by applying a polyester resin by a gravure coating method.

Example 2

The following (step 1) to (step 3) were carried out in this order to obtain a transparent high-barrier film of the present invention in Example 2 in which an anchor coat layer, a barrier layer and a top coat layer are stacked in this order on one surface of a plastic film (12 units are stacked, each unit having a structure of barrier layer A/barrier layer B/barrier layer A).

(Step 1) a 1.5 μm-thick anchor coat layer was stacked on one surface of a 38 μm-thick long polyethylene terephthalate film (trade name: COSMOSHINE A4300 manufactured by TOYOBO CO., LTD.) by applying an acrylic ultraviolet-curable resin by a gravure coating method.

(Step 2) a barrier layer having a total thickness of 180 nm was stacked on the anchor coat layer by stacking 12 units by a plasma-enhanced CVD method using hexamethyldisiloxane (HMDSO) as a silane-based compound, each unit having a structure in which a 5 nm-thick barrier layer A composed of SiOC, a 5 nm-thick barrier layer B composed of SiOC and a 5 nm-thick barrier layer A composed of SiOC are stacked in this order. The content ratio of carbon was 5.0% in each of the barrier layers A and 8.0% in each of the barrier layers B, and the content ratio of carbon in the barrier layer B was 1.6 times the content ratio of carbon in the barrier layer A.

(Step 3) a 0.1 μm-thick top coat layer was stacked on the barrier layer A by applying a polyester resin by a gravure coating method.

Comparative Example 1

Except that (step 2) in Example 1 was changed to a step of stacking only one 310 nm-thick barrier layer A on an anchor coat layer by a plasma-enhanced CVD method using hexamethyldisiloxane (HMDSO) as a silane-based compound, the same procedures as in Example 1 were carried out to obtain a barrier film of Comparative Example 1. The content ratio of carbon in the barrier layer A was 8.8%.

[Test Sample]

The transparent high-barrier films of the present invention obtained in Examples 1 and 2, and the barrier film obtained in Comparative Example 1 were each cut to a size of 5 cm square, and used as a test sample.

[Measurement of Water Vapor Transmission Rate]
(Measurement Method)

Using each test sample, measurement was performed by a water vapor transmission measurement apparatus (AQUATRAN 2 manufactured by MOCON, Inc.).

[Measurement of Total Light Transmittance]
(Measurement Method)

Using each test sample, measurement was performed by HazeMeter (NDH 2000 manufactured by Nippon Denshoku Industries Co., Ltd.) in accordance with JIS K 7361 method.

[Measurement Results]

The measurement results of the tests are shown in Table 1.

TABLE 1

| | Water vapor barrier property $(g/m^2 \cdot day)$ | Total light transmittance (%) |
|---|---|---|
| Example 1 | $5 \times 10^{-5}$ | 90.3 |
| Example 2 | $5 \times 10^{-5}$ | 90.4 |
| Comparative Example 1 | $5 \times 10^{-3}$ | 90.1 |

As described above, the transparent high-barrier films of the present invention obtained in Examples 1 and 2 each had a water vapor transmission rate of $5 \times 10^{-5}$ g/m²·day or less, and exhibited high barrier property, but the barrier film obtained in Comparative Example 1 had a water vapor transmission rate of $5 \times 10^{-3}$ g/m²·day, and did not exhibit high-barrier property.

In addition, the transparent high-barrier films of the present invention obtained in Examples 1 and 2 had high transmittivity with a total light transmittance of 80% or more.

[Preparation of High-Barrier Layered Body]

Example 3

A 25 μm-thick polyethylene terephthalate film was used as a functional film. This polyethylene terephthalate film and the polyethylene terephthalate film surface of the transparent high-barrier film of the present invention obtained in Example 1 were bonded to each other with a 25 μm-thick acrylic transparent pressure sensitive adhesive layer interposed therebetween, thereby preparing a high-barrier layered body of the present invention in Example 3. The transparent pressure-sensitive adhesive layer was stacked by transferring the pressure-sensitive adhesive layer to the polyethylene terephthalate film of the transparent high-barrier film of the present invention using a high-transparent pressure sensitive adhesive transfer tape with an acrylic transparent pressure sensitive adhesive layer uniformly formed between two plastic films (product number: DH 425A manufactured by Sun A. Kaken Co., Ltd.).

Example 4

Except that a transparent conductive film obtained by stacking a 36 nm-thick tin-doped indium oxide layer (ITO layer) as a functional layer (conductive layer) on a 50 μm-thick polyethylene terephthalate film was used in place of the 25 μm-thick polyethylene terephthalate film used in Example 3, and the polyethylene terephthalate film surface of the transparent high-barrier film of the present invention obtained in Example 1 and the polyethylene terephthalate film surface of the transparent conductive film were bonded to each other, the same procedures as in Example 3 were carried out to prepare a high-barrier layered body of the present invention in Example 4.

In the high-barrier layered body of the present invention obtained in Example 3, it was possible to increase the total thickness of the high-barrier layered body of the present invention and enhance the stiffness of the high-barrier layered body of the present invention while maintaining the high-barrier property of the transparent high-barrier film of the present invention obtained in Example 1. In addition, in the high-barrier layered body of the present invention obtained in Example 4, it was possible to impart the function of conductivity while maintaining the high-barrier property of the transparent high-barrier film of the present invention obtained in Example 1.

The invention claimed is:

1. A transparent high-barrier film comprising a plastic film, and at least a barrier layer stacked on one surface or both surfaces of the plastic film, the transparent high-barrier film satisfying all of the following requirements (A) to (C):
    (A) the barrier layer is a layer in which two or more units are stacked, each unit having a structure in which a barrier layer A, a barrier layer B and a barrier layer A are stacked in this order;
    (B) the barrier layer A is a layer composed of SiOC in which the content ratio of carbon quantitatively analyzed by X-ray photoelectron spectroscopy (XPS) of the barrier layer A is in a range of more than 0% and less than 15%; and
    (C) the barrier layer B is a layer composed of SiOC in which the content ratio of carbon quantitatively analyzed by X-ray photoelectron spectroscopy (XPS) of the barrier layer B is in a range of 1.1 to 4.0 times the content ratio of carbon in the barrier layer A.

2. The transparent high-barrier film according to claim 1, wherein the thickness of each of the barrier layer A and the barrier layer B is in a range of 5 to 30 nm.

3. A high-barrier layered body in which the transparent high-barrier film according to claim 1 and a functional film are bonded to each other with a pressure sensitive adhesive layer or adhesive layer interposed therebetween.

4. A high-barrier layered body in which the transparent high-barrier film according to claim 2 and a functional film are bonded to each other with a pressure sensitive adhesive layer or adhesive layer interposed therebetween.

5. The transparent high-barrier film according to claim 1, wherein the barrier layer is a layer in which 12 or more units are stacked, each unit having a structure in which a barrier layer A, a barrier layer B and a barrier layer A are stacked in this order.

6. The transparent high-barrier film according to claim 1, wherein the barrier layer is a layer in which 12 to 30 units are stacked, each unit having a structure in which a barrier layer A, a barrier layer B and a barrier layer A are stacked in this order.

7. The transparent high-barrier film according to claim 5, wherein the thickness of each of the barrier layer A and the barrier layer B is in a range of 5 to 30 nm.

8. The transparent high-barrier film according to claim 6, wherein the thickness of each of the barrier layer A and the barrier layer B is in a range of 5 to 30 nm.

9. A high-barrier layered body in which the transparent high-barrier film according to claim 5 and a functional film are bonded to each other with a pressure sensitive adhesive layer or adhesive layer interposed therebetween.

10. A high-barrier layered body in which the transparent high-barrier film according to claim 6 and a functional film are bonded to each other with a pressure sensitive adhesive layer or adhesive layer interposed therebetween.

11. The transparent high-barrier film according to claim 1, wherein all of the barrier layers A of the units have essentially the same content ratio of carbon.

12. The transparent high-barrier film according to claim 5, wherein all of the barrier layers A of the units have essentially the same content ratio of carbon.

13. The transparent high-barrier film according to claim 6, wherein all of the barrier layers A of the units have essentially the same content ratio of carbon.

14. The transparent high-barrier film according to claim 11, wherein all of the barrier layers B of the units have essentially the same content ratio of carbon.

15. The transparent high-barrier film according to claim 12, wherein all of the barrier layers B of the units have essentially the same content ratio of carbon.

16. The transparent high-barrier film according to claim 13, wherein all of the barrier layers B of the units have essentially the same content ratio of carbon.

* * * * *